US009159811B2

(12) United States Patent
Cheng et al.

(10) Patent No.: US 9,159,811 B2
(45) Date of Patent: Oct. 13, 2015

(54) GROWING BUFFER LAYERS IN BULK FINFET STRUCTURES

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Charan V. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 14/109,989

(22) Filed: Dec. 18, 2013

(65) Prior Publication Data
US 2015/0171193 A1     Jun. 18, 2015

(51) Int. Cl.
*H01L 21/8242* (2006.01)
*H01L 29/66* (2006.01)
*H01L 21/8234* (2006.01)

(52) U.S. Cl.
CPC .. *H01L 29/66803* (2013.01); *H01L 21/823431* (2013.01)

(58) Field of Classification Search
CPC .................................................. H01L 27/10826
USPC .................................................. 438/735–739
See application file for complete search history.

(56) References Cited

U.S. PATENT DOCUMENTS

| | | | |
|---|---|---|---|
| 7,309,660 B2 | 12/2007 | Chen | |
| 8,258,035 B2 | 9/2012 | Mathew et al. | |
| 2008/0087946 A1* | 4/2008 | Hsu et al. | 257/328 |
| 2009/0200604 A1* | 8/2009 | Chidambarrao et al. | 257/329 |
| 2011/0193141 A1 | 8/2011 | Lin et al. | |
| 2012/0153387 A1 | 6/2012 | Murthy et al. | |
| 2013/0026538 A1 | 1/2013 | Liao et al. | |
| 2013/0071980 A1 | 3/2013 | Lin et al. | |

OTHER PUBLICATIONS

Kedzierski et al. "Extension and Source/Drain Design for High-Performance FinFET Devices." IEEE Transactions on Electron Devices, vol. 50, No. 4 Apr. 2003, pp. 952-958, 0018-9383/03 2003 IEEE.

\* cited by examiner

*Primary Examiner* — Mohammad Choudhry
(74) *Attorney, Agent, or Firm* — Scully, Scott, Murphy & Presser, P.C.; Yuanmin Cai

(57) ABSTRACT

A semiconductor structure may be formed by forming a fin on a substrate, forming a gate over a portion of the fin, removing a portion of the fin not below the gate to expose a sidewall of the fin beneath the gate and a top surface of the substrate, forming a first protective layer on the top surface of the substrate but not on the sidewall of the fin, forming a second protective layer on the sidewall of the fin prevented from forming on the top surface of the substrate by the first protective layer, removing the first protective layer to expose the top surface of the substrate, forming a buffer layer on the top surface of the substrate; the buffer layer prevented from forming on the sidewall of the fin by the second protective layer, and forming a source-drain region on the buffer layer electrically connected to the fin.

20 Claims, 8 Drawing Sheets

# GROWING BUFFER LAYERS IN BULK FINFET STRUCTURES

BACKGROUND

The present invention relates to semiconductor devices, and particularly to fabricating bulk finFET devices having buffer layers insulating source/drain regions from an underlying substrate.

Field effect transistors (FETs) are commonly employed in electronic circuit applications. FETs may include a source region and a drain region spaced apart by a semiconductor channel region. A gate, potentially including a gate dielectric layer, a work function metal layer, and a metal electrode, may be formed above the channel region. By applying voltage to the gate, the conductivity of the channel region may increase and allow current to flow from the source region to the drain region. FET structures having n-type source and drain regions may be referred to as nFETs, and FET structures having p-type source and drain regions may be referred to as pFETs.

FinFETs are an emerging technology which may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFETs may be formed on bulk substrates to reduce wafer cost and/or enable formation of certain devices in the bulk substrate.

SUMMARY

An embodiment of the invention may include a method of forming a semiconductor structure by forming a fin on a substrate, forming a gate over a portion of the fin, removing a portion of the fin not below the gate to expose a sidewall of the fin beneath the gate and a top surface of the substrate, forming a first protective layer on the top surface of the substrate but not on the sidewall of the fin, forming a second protective layer on the sidewall of the fin prevented from forming on the top surface of the substrate by the first protective layer, removing the first protective layer to expose the top surface of the substrate, forming a buffer layer on the top surface of the substrate; the buffer layer prevented from forming on the sidewall of the fin by the second protective layer, and forming a source-drain region on the buffer layer electrically connected to the fin.

Another embodiment of the invention may include another method of forming a semiconductor structure by providing a bulk fin structure including a fin on a semiconductor substrate and a gate over a portion of the fin, recessing the fin of the bulk fin structure to expose a recessed horizontal surface of the substrate and a vertical sidewall of the fin, depositing a high-density plasma (HDP) oxide on the recessed horizontal surface of the substrate and the vertical sidewall of the fin so that more HDP oxide is deposited on the recessed horizontal surface than the vertical sidewall, etching the HDP oxide so that the HDP oxide is completely removed from the vertical sidewall but not completely removed from the recessed horizontal surface, doping the sidewall while the horizontal surface is protected by the HDP oxide, stripping the HDP oxide from the horizontal surface, growing a buffer layer on the horizontal surface, and growing a doped semiconductor region on the buffer layer.

Figure 1:
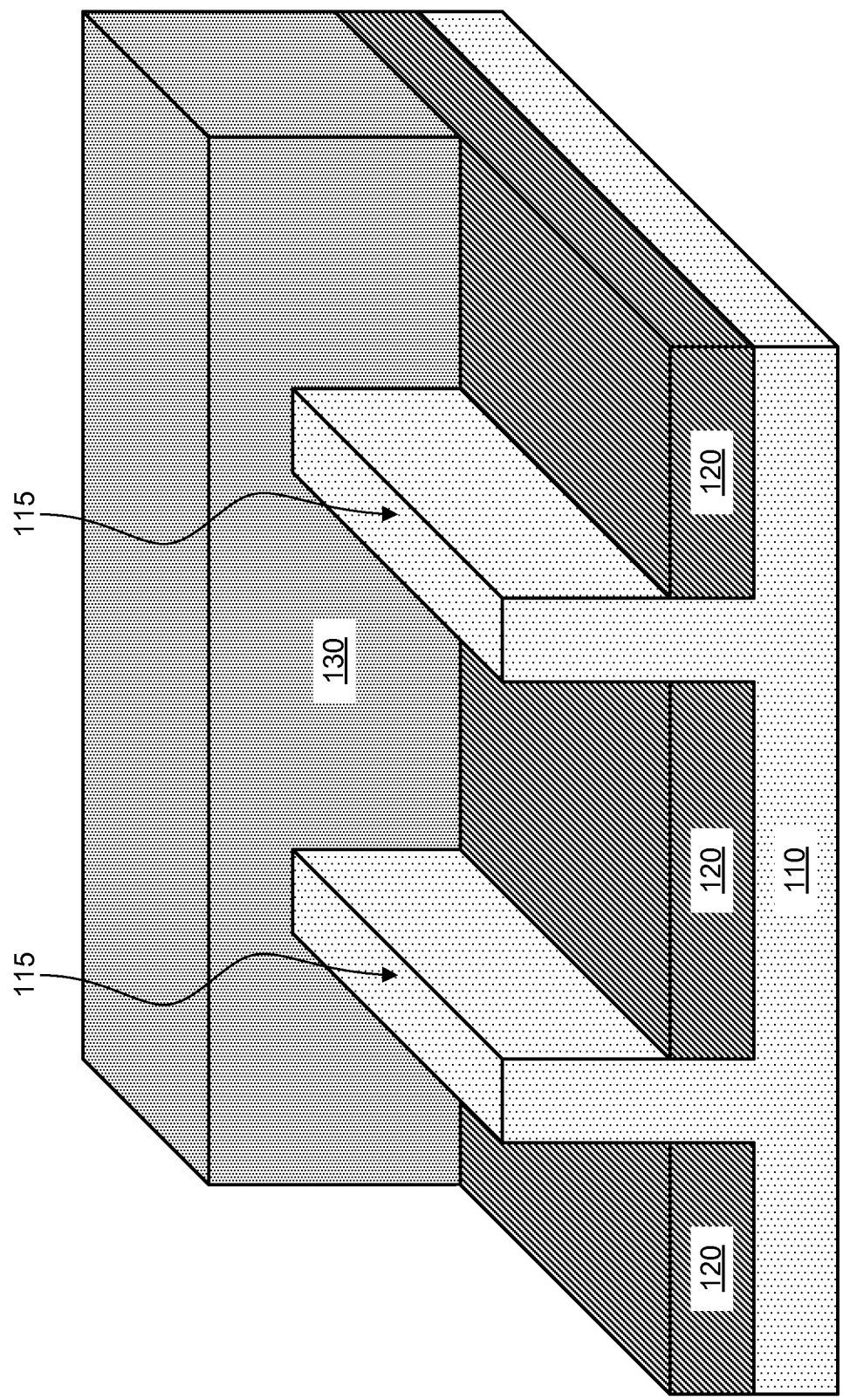
FIG. 1 is an isometric view depicting a bulk finFET structure including fins on a substrate, an insulating layer around the base of the fins, and a gate over portions of the fins, according to an embodiment of the present invention.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FinFETs may be formed by forming at least one fin from a semiconductor substrate, forming a gate around a portion of the at least one fin, and forming source/drain regions adjacent to the portion of the fin beneath the gate. When forming finFETs from a bulk semiconductor wafer, device performance may be improved by forming a buffer layer beneath the source/drain regions to electrically isolate the source/drain regions from the underlying substrate. However, device performance may be reduced if the buffer layer is also formed between the source/drain region and the portion of the fin beneath the gate. Methods of forming a buffer layer beneath the source/drain regions without forming the buffer layer between the source/drain region and the portion of the fin beneath the gate is described below in conjunction with FIGS. 1-8.

Referring to FIG. 1, a bulk fin field effect transistor (finFET) structure 100 may be formed including one or more fins 115 on a substrate 110, an insulating layer 120 surrounding a bottom portion of the fins 115, and a gate 130 above a portion of the fins 115. While the depicted embodiment includes two fins 115, it will be understood that embodiments may include as few as one fin, as well as more than two fins. In an exemplary embodiment, the fins 115 may have a width ranging from approximately 2 nm to approximately 40 nm, preferably approximately 4 nm to approximately 20 nm; a height ranging from approximately 5 nm to approximately 300 nm, preferably approximately 10 nm to approximately 80 nm.

The fins 115 may be formed, for example by removing material from the substrate 110 using a photolithography process followed by an anisotropic etching process such as reactive ion etching (RIE) or plasma etching. Other methods of forming fins known in the art may also be utilized, such as sidewall image transfer (SIT). The substrate 110 may be any substrate typically known in the art, including, for example, a bulk substrate made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Because the substrate 110 may be a bulk substrate, the material of the fins 115 may be the same as the substrate 110 and there may be no identifiable boundary between the fins 115 and the substrate 110. Typically the substrate 110 may be about, but is not limited to, several hundred microns thick.

After forming the fins 115, the insulating layer 120 may optionally be formed by depositing any suitable insulating material using any suitable deposition technique commonly known in the art, including for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). In an exemplary embodiment, the insulating layer 120 may be formed by depositing a silicon oxide layer having a thickness ranging from approximately 5 nm to approximately 150 nm, preferably approximately 30 nm to approximately 100 nm. In another embodiment, the insulating layer 120 may be formed by a isotropic implantation process which adds dopants, such as oxygen or nitrogen, to a top portion of the substrate 110 so that the top portion of the substrate 110 is insulating without adding dopants to the fins 115.

After forming the insulating layer 120, the gate 130 above a portion of the fins 115. While only a single gate 210 is shown, some embodiments may include more than one gate above the fin 120. If the insulating layer 120 is present, the gate 130 may be separated from the substrate 110 by the insulating layer 120. The gate 130 may have a height of approximately 40 nm to approximately 200 nm, preferably approximately 50 nm to approximately 150 nm. The gate 130 may include a gate dielectric layer on the fins 115 (not shown) and a gate electrode on the gate dielectric layer (not shown) that may be formed via any known process in the art, including a gate-first process and a gate-last process. The gate 130 may also include a hard cap (not shown) made of an insulating material, such as, for example, silicon nitride, capable of protecting the gate electrode and gate dielectric during subsequent processing steps.

In a gate-first process, the gate dielectric layer may include any suitable insulating material including, but not limited to: oxides, nitrides, oxynitrides or silicates including metal silicates and nitrided metal silicates. In one embodiment, the gate dielectric may include an high-k oxide such as, for example, silicon oxide ($Si_xO_y$), hafnium oxide ($Hf_xO_y$), zirconium oxide ($Zr_xO_y$), aluminum oxide ($Al_xO_y$), titanium oxide ($Ti_xO_y$), lanthanum oxide ($La_xO_y$), strontium titanium oxide ($Sr_xTi_yO_z$), lanthanum aluminum oxide ($La_xAl_yO_z$), and mixtures thereof. The gate dielectric layer may be deposited over the fins 115 using any suitable deposition technique known the art, including, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating.

In a gate-last process, the gate 130 may include a sacrificial gate (not shown) that may be later removed and replaced by a gate dielectric layer and a gate electrode such as those of the gate-first process described above. In an exemplary embodiment, the sacrificial gate may be made of a polysilicon material with a sacrificial dielectric material (e.g., silicon oxide) formed using known deposition techniques known in the art, including, for example, ALD, CVD, PVD, MBD, PLD, LSMCD, sputtering, and plating. Other suitable materials and methods of forming a sacrificial gate are known in the art.

The gate 130 may further include spacers (not shown) formed on sidewalls of the gate electrode and gate dielectric layer. The spacers may be made of any suitable insulating material, such as silicon nitride, silicon oxide, silicon oxynitrides, or a combination thereof, and may have a thickness ranging from 2 nm to approximately 100 nm, In a preferred embodiment, the spacers may be made of silicon nitride and have a thickness ranging from approximately 2 nm to approximately 25 nm. The spacers may be formed by any method known in the art, including depositing a conformal silicon nitride layer over the gate electrode and removing unwanted material from the conformal silicon nitride layer using a anisotropic etching process such as, for example, reactive ion etching (RIE) or plasma etching. Methods of forming spacers are well-known in the art and other methods are explicitly contemplated. Further, in various embodiments, the spacers may include one or more layers. While the spacers are herein described in the plural, the spacers may consist of a single spacer surrounding the gate electrode.

Figure 2:
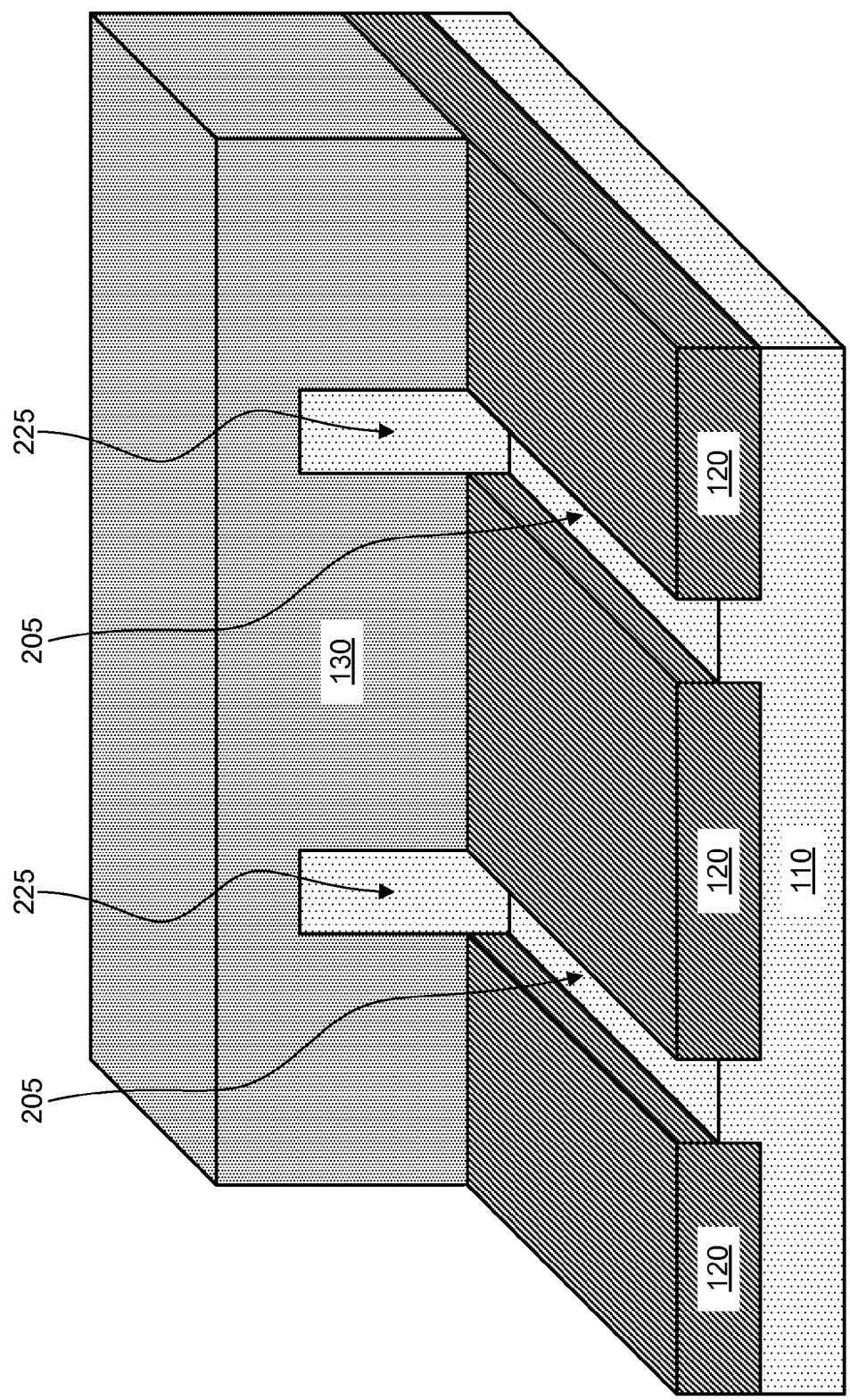
FIG. 2 is an isometric view depicting removing portions of the fins outside the gate, according to an embodiment of the present invention.

Referring to FIG. 2, portions of the fins 115 not covered by the gate 130 may be removed to expose sidewalls 225 of the fins 115 and to expose top surfaces 205 of the substrate 110. In a preferred embodiment, portions of the fins 115 may be removed in a manner so that the top surfaces 205 remain above the bottom surface of the insulating layer 120. For example, the top surfaces 205 may be positioned up to approximately 5 nm below the top surface of the insulating layer 120. The portions of the fins 115 may be removed using any suitable anisotropic etching process capable of removing material from the fins 115 without substantially impacting the surrounding structures, including, but not limited to, the gate 130, the insulating layer 120, and the substrate 110. Exemplary etching processes may include, for example, RIE and plasma etching.

Figure 3:
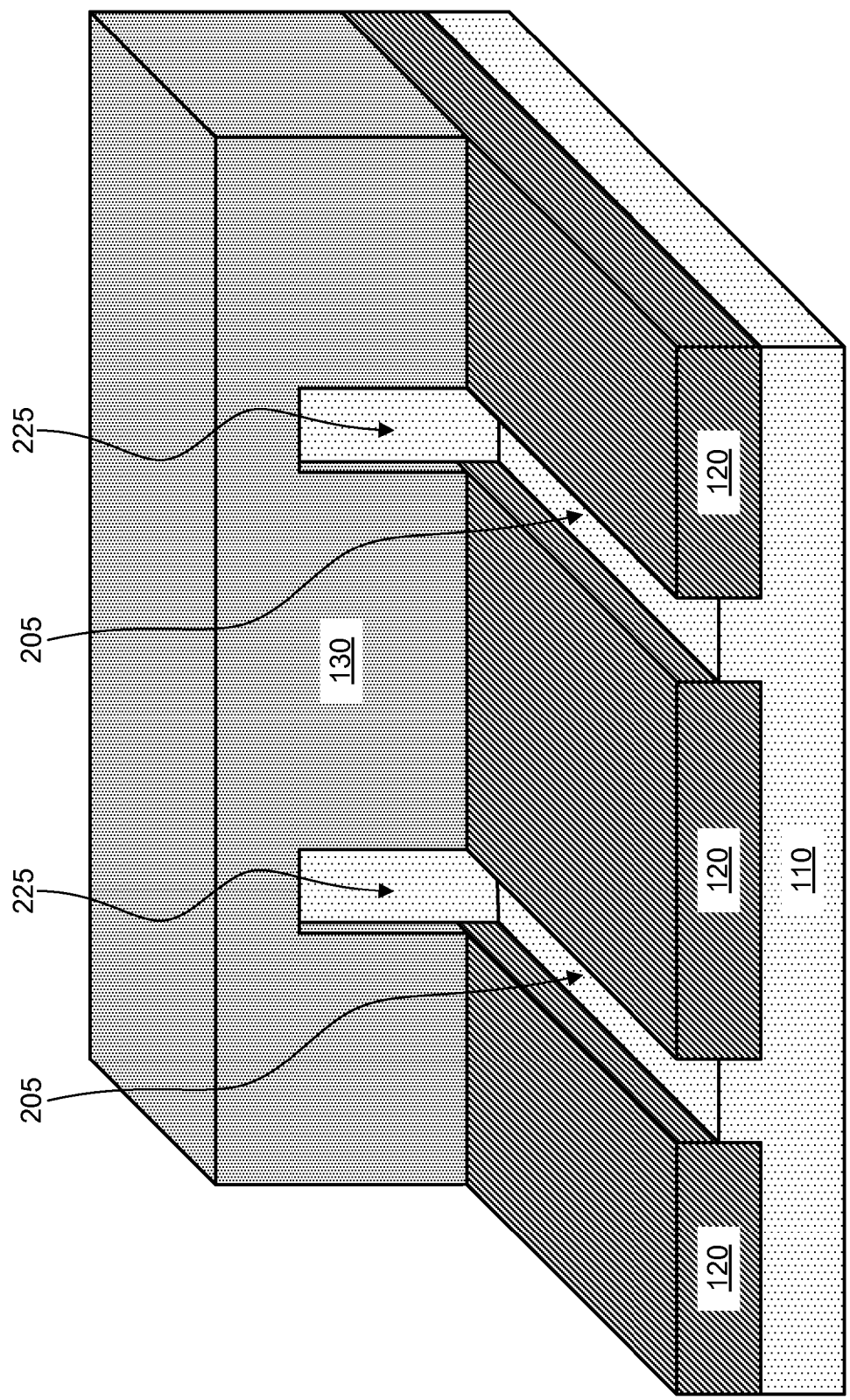
FIG. 3 is an isometric view depicting recessing the fins beneath the gate, according to an embodiment of the present invention.

Referring to FIG. 3, the sidewalls 225 of the fins 115 may optionally be recessed beneath the gate 120. In one embodiment the recess may not be deeper than the thickness of the spacers (not shown) of the gate 130. In an exemplary embodiment where the spacers have a thickness of approximately 6 nm, the sidewalls 225 may be recessed by a depth ranging from approximately 1 nm to approximately 6 nm, preferably approximately 2 nm to approximately 4 nm. In one embodiment, the sidewalls 225 may be recessed by a wet or gaseous etch process capable of selectively removing material from the fins 115. Exemplary wet or gaseous etchants may include tetramethylammonium hydroxide (TMAH) and gaseous hydrogen chloride (HCl). In another embodiment, the sidewalls 225 may be formed by an angled anisotropic etching process, such as RIE or plasma etching. In embodiments where an isotropic etching process such as a wet or gaseous etch is used, the top surfaces 205 of the substrate 110 may also be recessed by a similar amount as the sidewalls 225. To compensate, a smaller portion of the fins 115 may be removed, as described above in conjunction with FIG. 2, so that the top surfaces 205 are at the desired height following recessing the sidewalls 225.

Figure 4:
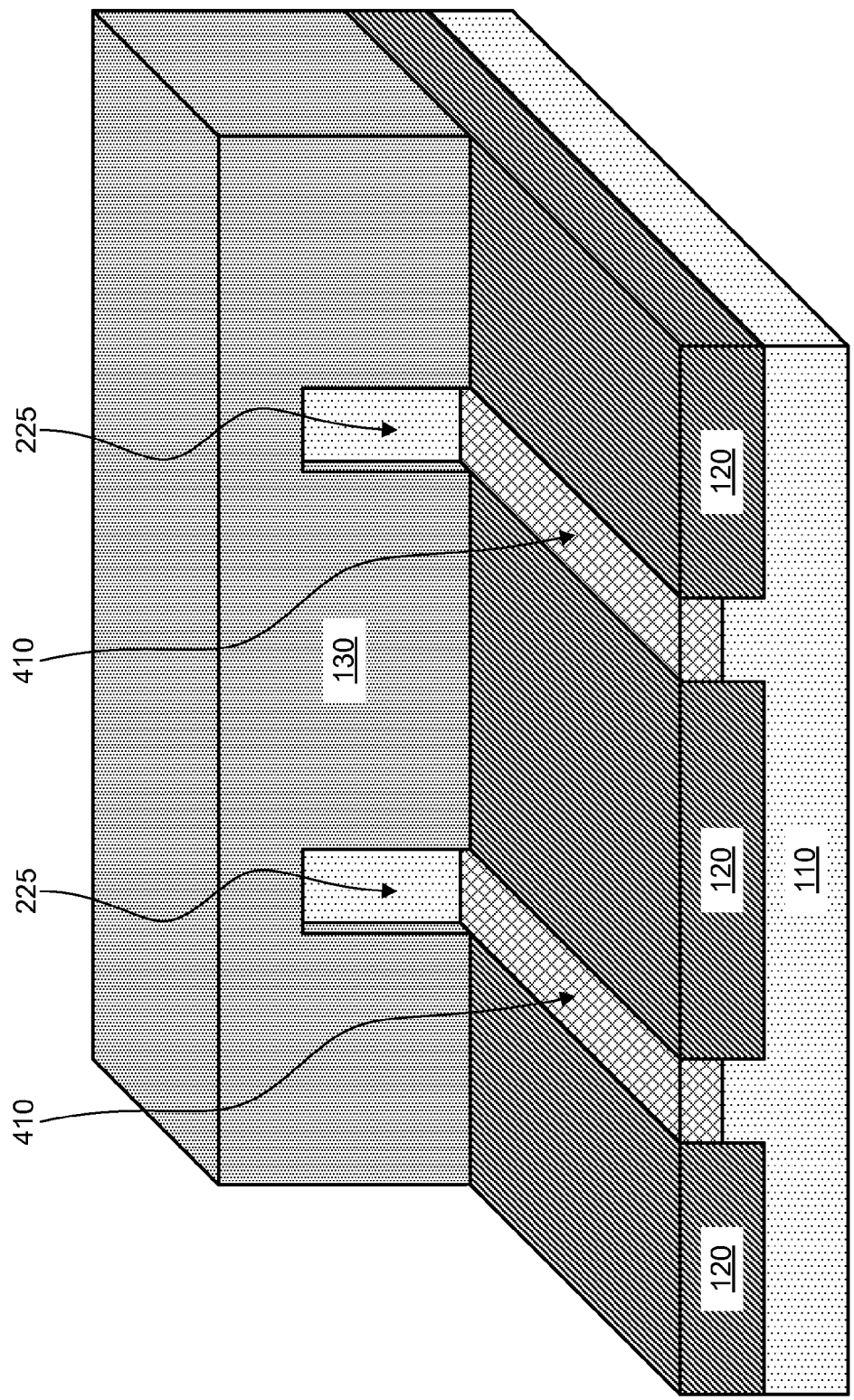
FIG. 4 is an isometric view depicting forming first protective layers over the exposed portions of the substrate, according to an embodiment of the present invention.

Referring to FIG. 4, first protective layers 410 may be formed covering the top surfaces 205 (FIG. 3) of the substrate 110. The protective first layers 410 may be of sufficient thickness to prevent second protective layers 510 (FIG. 5) subsequently formed on sidewalls 225 of the fins 115 from being formed on the substrate 110. The thickness of the first protective layers 410 may vary depending on the material and method used to form the first protective layers 410. The first protective layers 410 may be formed by any suitable method in the art capable of forming a layer capable of preventing the second protective layers 510 from being formed on the substrate 110 and being removed selectively after formation of the second protective layers 510. Several exemplary methods are described below.

In one embodiment, the first protective layers 410 may be formed by first depositing a non-uniform high-density plasma (HDP) oxide layer (not shown) over the structure, including the top surfaces 205 of the substrate 110, using a directional deposition process such as high density plasma deposition, such that it covers surfaces parallel to the plasma source, without causing excessive perpendicular deposition (i.e. minimizing deposition of the first protective layers 410 along the sidewalls of the fins 225). Because of the directional deposition process used, the HDP oxide layer will have a greater thickness on horizontal surfaces, such as the top surfaces 205 of the substrate 110, than on vertical surfaces, such as the sidewalls 225. The thickness differential may be increased by recessing the sidewalls 225 beneath the gate 130, as described above in conjunction with FIG. 3. An isotropic etching process may then be used to remove the HDP oxide layer from unwanted surfaces such as the sidewalls 225. By timing the etch process to remove approximately the thickness of the vertical portions of the HDP oxide layer, horizontal portions of the HDP oxide layer may remain to form the first protective layers 410. After the etching process, the protective layers 410 may also cover horizontal surfaces of the gate 130 and the insulating layer 120 (not shown). Exemplary etching processes suitable for removing portions of the HDP oxide layer may include RIE or aqueous hydrofluoric acid.

In another embodiment, the first protective layers 410 may be formed by incorporating a protective species into the top surfaces 205 of the substrate 110. Exemplary protective species may include oxygen and nitrogen. The concentration of the protective species incorporated in the substrate 110 may be sufficient to prevent the second protective layers 510 (FIG. 5) from forming on the substrate 110. In an exemplary embodiment, the concentration of oxygen or nitrogen in the first protective layers 410 formed by implantation may range from approximately $5 \times 10^{21}$ atoms/cm$^3$ to approximately $3 \times 10^{22}$ atoms/cm$^3$. The protective species may be implanted into the substrate 110 using any suitable implantation process, including gas cluster ion beam (GCIB) and plasma oxidation or nitridation. In an exemplary embodiment where GCIB is utilized, the protective species may be implanted using an implantation energy ranging from approximately 5 keV to approximately 300 keV, preferably approximately 10 keV to approximately 100 keV. In some embodiments, the implanted species, such as oxygen or nitrogen, may react with the substrate, such as silicon, to form, for example, silicon oxide or silicon nitride.

In some embodiments, a protective nitride spacer (not shown) may be formed over the sidewalls 225 prior to forming the first protective layers 410 to further ensure that the first protective layers 410 do not form on the sidewalls 225. The protective nitride spacer may be formed by any method known in the art, including depositing a conformal silicon nitride layer over the gate electrode and removing unwanted material from the conformal silicon nitride layer using a anisotropic etching process such as, for example, reactive ion etching (RIE) or plasma etching. The protective spacer may have a thickness ranging from approximately 1 nm to approximately 10 nm, preferably approximately 2 nm to approximately 6 nm.

In embodiments where the protective spacer is formed, the first protective layers 410 may also be formed by a thermal oxidation process instead of the implantation process discussed above. The protective spacers may then be stripped using a suitable wet or dry isotropic etch process after formation of the first protective layers 410 to expose the sidewalls 225. While the protective spacer is preferably stripped using a selective etch process, structure components such as the first protective layers 410 may also be partially removed while removing the protective spacer. In such cases, a person of ordinary skill in the art may understand how to form these components with a sufficient thickness to prevent etching to undesirable degrees.

Figure 5:
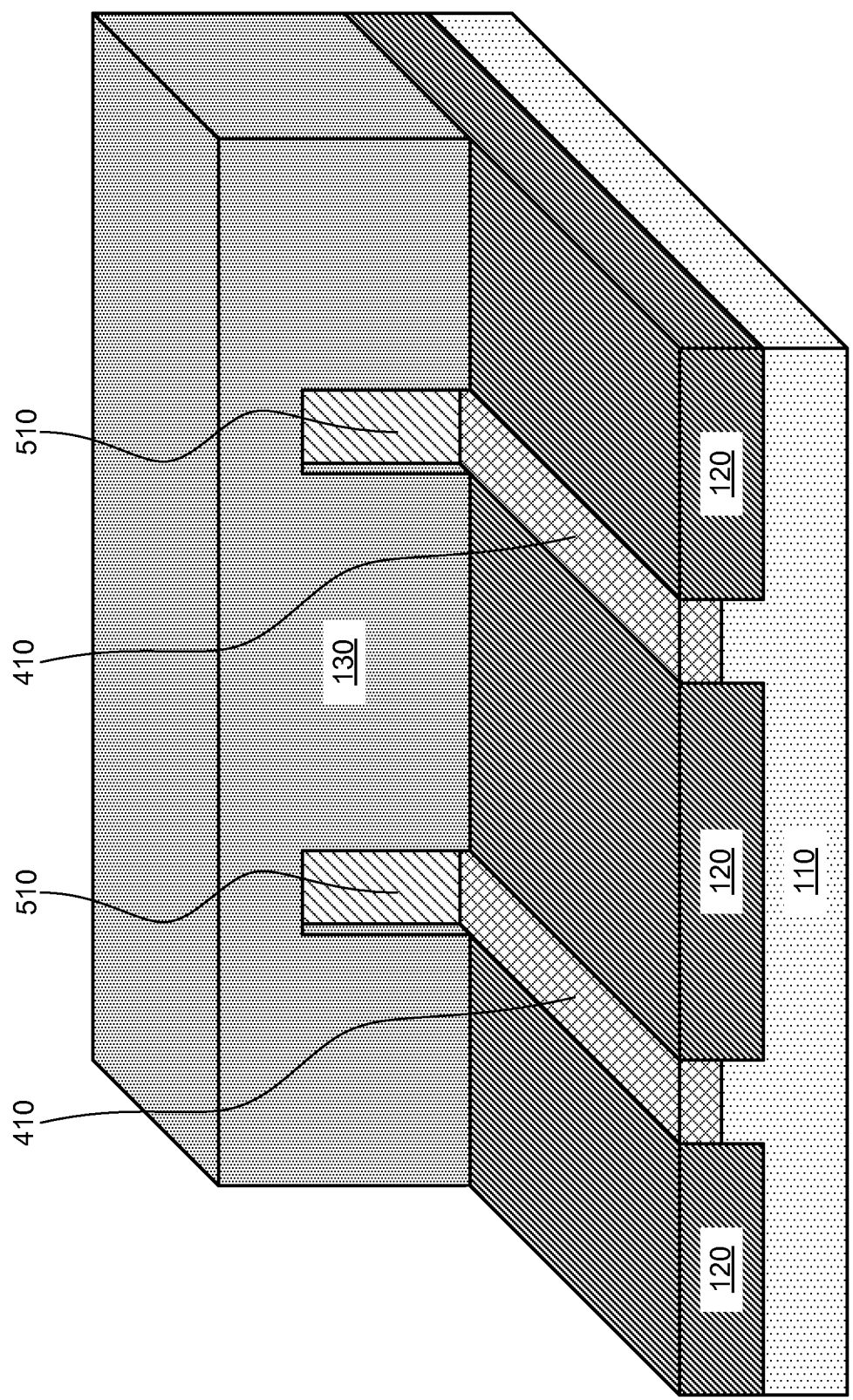
FIG. 5 is an isometric view depicting forming second protective layers over the exposed sidewalls of the fins, according to an embodiment of the present invention.

Referring to FIG. 5, second protective layers 510 may be formed covering the sidewalls 225 (FIG. 4) of the fins 115. The second protective layers 510 may have sufficient thickness to prevent the buffer layers 710 (FIG. 7) subsequently formed on the substrate 110 from being formed on the sidewalls 225. The thickness of the second protective layers 510 may vary depending on the material and method used to form the second protective layers 510. The second protective layers may be formed by any suitable method in the art capable of preventing the buffer layers 710 from forming on the sidewalls 225 and being removed selectively relative to the first protective layers 410. Several exemplary methods are described below.

In one embodiment, the second protective layers 510 may be formed by implanting dopants into the sidewalls 510 using any suitable implantation process. The dopants may then interfere with the epitaxial growth process used to form the buffer layers 710, thereby prevent formation of the buffer layers 710 on the fins 115. If the finFET structure being formed is a pFET, p-type dopants such as boron may be used in concentrations ranging from approximately $1\times10^{18}$ atoms/cm$^3$ to approximately $1\times10^{21}$ atoms/cm$^3$, preferably $1\times10^{19}$ atoms/cm$^3$ to approximately $1\times10^{20}$ atoms/cm$^3$. If the finFET structure being formed is an nFET, n-type dopants such as arsenic or phosphorus may be used in concentrations ranging from approximately $1\times10^{18}$ atoms/cm$^3$ to approximately $1\times10^{21}$ atoms/cm$^3$, preferably $1\times10^{19}$ atoms/cm$^3$ to approximately $1\times10^{20}$ atoms/cm$^3$. In embodiments where the second protective layers 510 are formed by dopant implantation, the second protective layers 510 may have a thickness ranging from approximately 1 nm to approximately 6 nm, preferably approximately 2 nm to approximately 4 nm.

In another embodiment where the first protection layers 410 are made of silicon nitride, the second protective layers 510 may be formed by thermally oxidizing the sidewalls 510. Because subsequent processes (e.g., the pre-clean process prior to growing the buffer layers 710 (FIG. 7)) may include steps that may remove oxide, the thickness of the second protective layers 510 may be great enough so that sidewalls 510 remain covered by the second protective layers 510 through said processes. In embodiments where the second protective layers 510 are formed by thermal oxidation, the second protective layers 510 may have a thickness ranging from approximately 1 nm to approximately 6 nm, preferably approximately 2 nm to approximately 4 nm.

Figure 6:
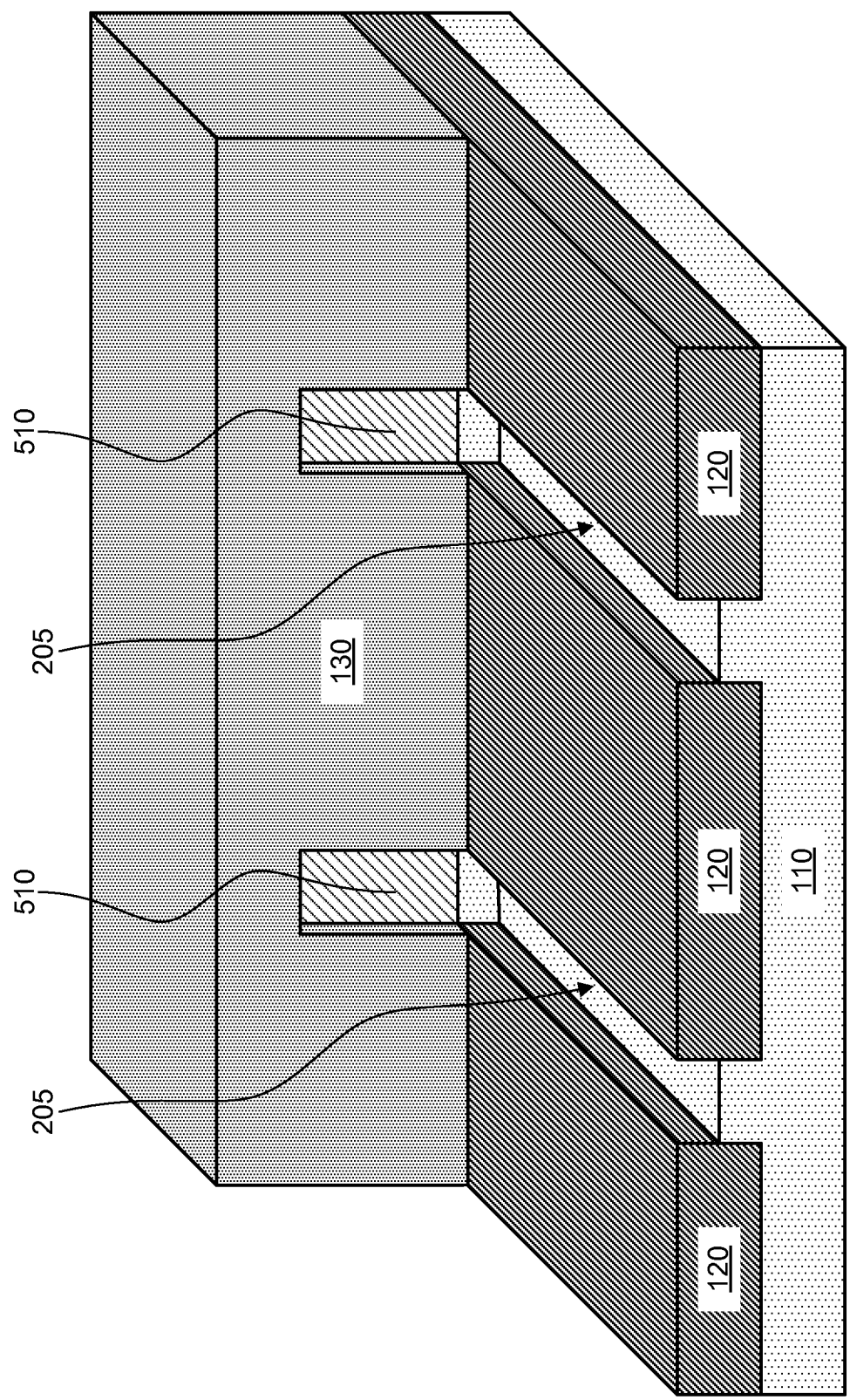
FIG. 6 is an isometric view depicting removing the first protective layers from the exposed portions of the substrate, according to an embodiment of the present invention.

Referring to FIG. 6, after forming the second protective layers 610, the first protective layers 510 may be removed to expose the top surfaces 205 of the substrate 105. The first protective layers 510 may be removed by any suitable etching method capable of selectively removing the protective layers without substantially removing the second protective layers 610. Suitable etching processes may be either wet or dry and anisotropic. In some embodiments where the first protective layers 510 are made of a similar material to surrounding structures (e.g., the insulating layer 120, or spacers (not shown) of the gate 130), a portion of those surrounding structures may be removed as well. In such cases, these surrounding structures may be formed with a greater initial thickness to compensate. In some embodiments, removing the first protective layers 410 may be combined with forming the buffer layers 710 (FIG. 7), where the first protective layers 410 are removed by a pre-clean step of an epitaxial growth process.

Figure 7:
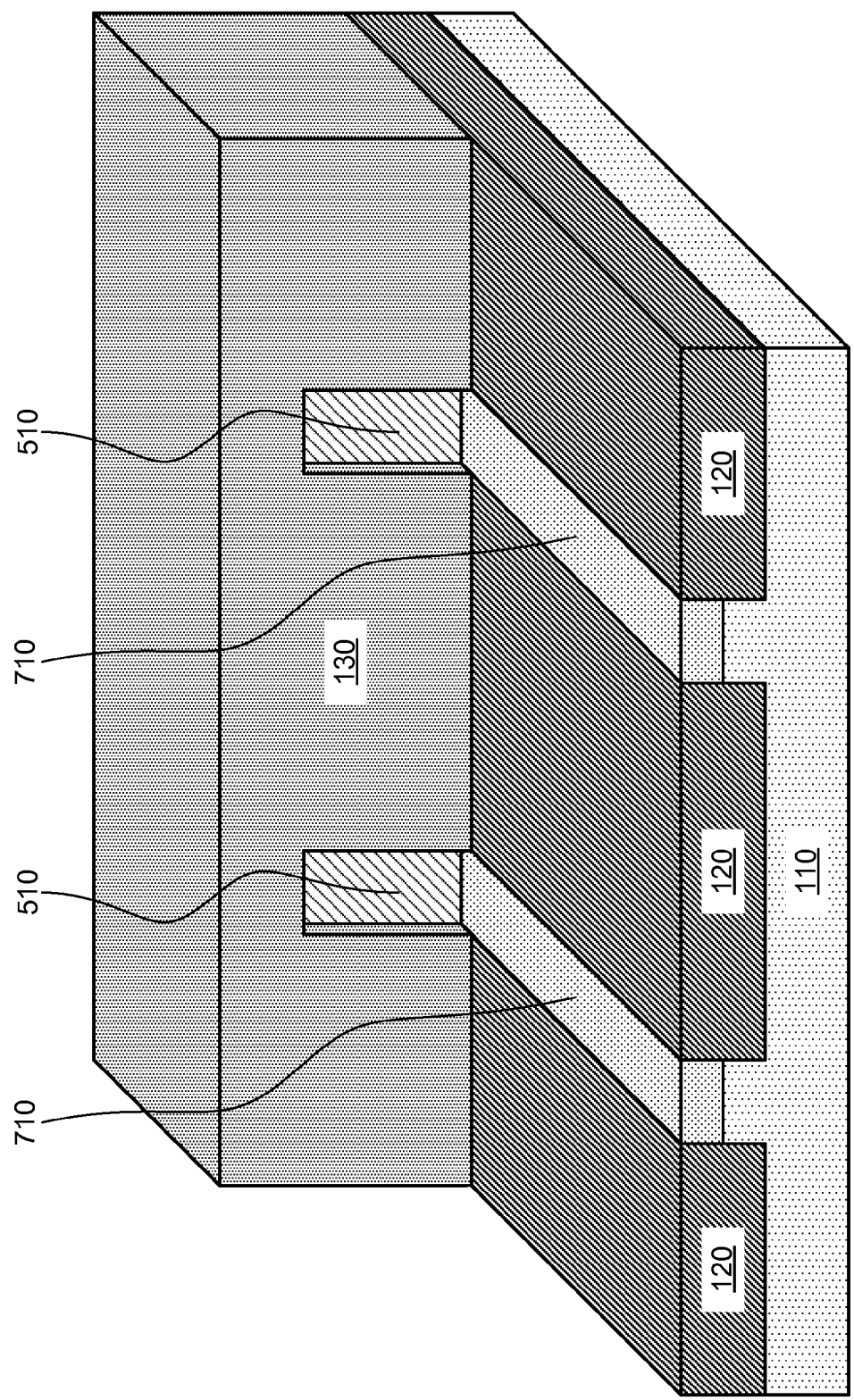
FIG. 7 is an isometric view depicting forming buffer layers over the exposed portions of the substrate, according an embodiment of the present invention.

Referring to FIG. 7, buffer layers 710 may be grown on the exposed top surfaces 205 of the substrate 105 to electrically isolate the subsequently formed source-drain regions 810 (FIG. 8) from the substrate 105 and minimize current leakage from the source-drain regions 810 into the substrate. The buffer layers 710 may be made of any suitable semiconductor material with more insulative properties relative to the source-drain regions 810. Preferably, the buffer layers 710 are made of the same semiconductor material as the source-drain regions 810, but with either substantially less dopant concentration or dopants of the opposite type. By fabricating the buffer layers 710 of the same semiconductor as the source-drain regions 810, the buffer layers 710 may better support the epitaxial growth of the source-drain regions 810 while enhancing the stress applied to the fins 115 by the source-drain regions 810 and the buffer layers 710. For example, for pFETs where the source-drain regions 810 are made of boron-doped silicon-germanium, the buffer layers 710 may be made of undoped or n-doped (e.g., arsenic- or phosphorus-doped) silicon-germanium. For nFETs where the source-drain regions 810 are made of arsenic- or phosphorus-doped silicon or carbon-doped silicon, the buffer layers 710 may be made of p-doped (e.g., boron-doped) silicon or silicon carbon.

Figure 8:
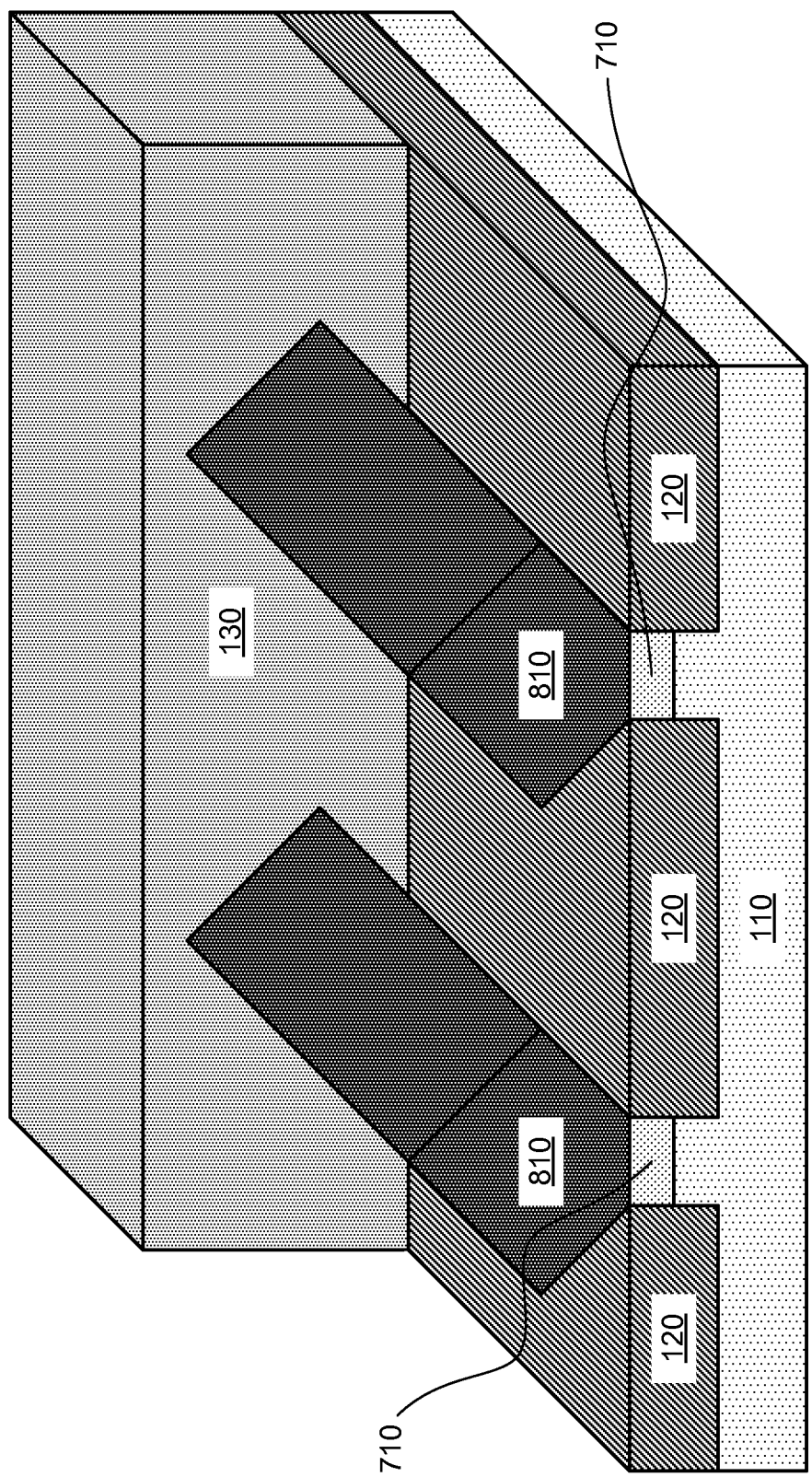
FIG. 8 is an isometric view depicting forming source/drain regions above the buffer layers, according an embodiment of the present invention.

Referring to FIG. 8, the source/drain regions 810 may be formed by growing or depositing epitaxial semiconductor regions on the buffer layers 710, so that the source/drain regions 810 contact the second protective layers 510, if present, or the fins 115, if the second protective layers 510 have been removed. If the second protective layers 510 are present, the source/drain regions 810 may be electrically connected to the fins 115 through the second protective layers. The source/drain regions 810 may be unmerged, as depicted in FIG. 8, or merged so that a single semiconductor region is electrically connected to both fins 115 (not shown). A merged source/drain may be formed by continuing the epitaxial growth process until the source/drain regions 810 are in contact with one another. Depending on the type of finFET device being formed (i.e., pFET or nFET), the source/drain regions 810 may be made of, for example, silicon, a silicon-germanium alloy, or carbon doped silicon.

For example, for a pFET, the epitaxially grown source/drain region 810 may be made of silicon or a silicon germanium-alloy, where the atomic concentration of germanium may range from about approximately 10% to approximately 80%, preferably from approximately 20% to approximately 60%. Dopants such as boron may be incorporated into the source/drain region 402 by in-situ doping. The percentage of boron may range from approximately $1\times10^{19}$ cm$^{-3}$ to approximately $2\times10^{21}$ cm$^{-3}$, preferably approximately $1\times10^{20}$ cm$^{-3}$ to approximately $1\times10^{21}$ cm$^{-3}$.

For example, for an nFET, the epitaxially grown source/drain region 402 may be made of silicon or carbon-doped silicon, where the atomic concentration of Carbon (C) may range from approximately 0.4% to approximately 3.0%, preferably from approximately 0.5% to approximately 2.5%. Dopants such as phosphorous or arsenic may be incorporated into the source/drain region 402 by in-situ doping. The percentage of phosphorous or arsenic may range from approximately $1\times10^{19}$ cm$^{-3}$ to approximately $2\times10^{21}$ cm$^{-3}$, preferably approximately $1\times10^{20}$ cm$^{-3}$ to approximately $1\times10^{21}$ cm$^{-3}$.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

The invention claimed is:

1. A method of forming a semiconductor structure, the method comprising:
    forming a fin on a semiconductor substrate;
    forming a gate over a portion of the fin;

removing a portion of the fin not below the gate to expose a sidewall of the fin beneath the gate and a top surface of the semiconductor substrate;

forming a first protective layer on the top surface of the semiconductor substrate, the first protective layer not on the sidewall of the fin;

forming a second protective layer on the sidewall of the fin, the second protective layer prevented from forming on the top surface of the semiconductor substrate by the first protective layer;

removing the first protective layer to expose the top surface of the semiconductor substrate;

forming a buffer layer on the top surface of the semiconductor substrate; the buffer layer prevented from forming on the sidewall of the fin by the second protective layer; and forming a source-drain region on the buffer layer, the source-drain region electrically connected to the fin.

2. The method of claim 1, further comprising recessing the sidewall of the fin beneath the gate prior to forming the first protective layer.

3. The method of claim 1, wherein forming the first protective layer on the top surface of the semiconductor substrate comprises:

depositing a high-density plasma (HDP) oxide layer over the top surface of the semiconductor substrate, wherein the HDP oxide layer has a greater thickness on the top surface of the semiconductor substrate than on the sidewall of the fin; and etching the HDP oxide layer using an isotropic etching process so that the HDP oxide layer is not on the sidewall of the fin but on the top surface of the semiconductor substrate.

4. The method of claim 1, wherein forming the first protective layer on the top surface of the semiconductor substrate comprises implanting a protective species into the top surface of the semiconductor substrate.

5. The method of claim 4, wherein the protective species comprises oxygen or nitrogen.

6. The method of claim 1, wherein forming the first protective layer on the top surface of the semiconductor substrate comprises:

forming a protective spacer over the sidewall of the fin;

thermally oxidizing the top surface of the semiconductor substrate, whereby the protective spacer prevents oxidation of the sidewall of the fin; and removing the protective spacer.

7. The method of claim 1, wherein forming the second protective layer comprises implanting dopants into the sidewall of the fin.

8. The method of claim 7, wherein the dopants comprises arsenic, phosphorus, or boron.

9. The method of claim 1, wherein forming the second protective layer comprises thermally oxidizing the sidewall of the fin.

10. The method of claim 9, further comprising removing the second protective layer prior to forming the source-drain region on the buffer layer.

11. The method of claim 10, wherein the second protective layer is removed by a pre-clean process of forming a buffer layer on the top surface of the semiconductor substrate.

12. The method of claim 1, wherein forming a buffer layer on the top surface of the semiconductor substrate comprises growing undoped semiconductor material on the top surface of the semiconductor substrate.

13. The method of claim 1, wherein buffer layer on the top surface of the semiconductor substrate comprises growing doped semiconductor material on the top surface of the semiconductor substrate, wherein the buffer layer is oppositely doped relative to the source-drain region.

14. A method of forming a semiconductor structure, the method comprising:

providing a bulk fin structure, the bulk fin structure comprising a fin on a semiconductor substrate and a gate over a portion of the fin;

recessing the fin of the bulk fin structure to expose a recessed horizontal surface of the substrate and a vertical sidewall of the fin;

depositing a high-density plasma (HDP) oxide on the recessed horizontal surface of the substrate and the vertical sidewall of the fin, wherein more of the HDP oxide is deposited on the recessed horizontal surface than the vertical sidewall;

etching the HDP oxide so that the HDP oxide is completely removed from the vertical sidewall but not completely removed from the recessed horizontal surface;

doping the sidewall while the horizontal surface is protected by the HDP oxide;

stripping the HDP oxide from the horizontal surface;

growing a buffer layer on the horizontal surface; and growing a doped semiconductor region on the buffer layer.

15. The method of claim 14, further comprising recessing the vertical sidewall of the fin beneath the gate prior to depositing the HDP oxide.

16. The method of claim 14, wherein doping the sidewall comprises implanting n-type or p-type dopants into the sidewall.

17. The method of claim 16, wherein the n-type dopant comprises arsenic or phosphorus.

18. The method of claim 16, wherein the p-type dopant comprises boron.

19. The method of claim 14, wherein growing a buffer layer on horizontal surface comprises growing undoped semiconductor material on the top surface of the semiconductor substrate.

20. The method of claim 14, wherein growing a buffer layer on horizontal surface comprises growing doped semiconductor material on the top surface of the semiconductor substrate, wherein the buffer layer is oppositely doped relative to the doped semiconductor region.

* * * * *